(12) United States Patent
Matsuo et al.

(10) Patent No.: US 12,444,698 B1
(45) Date of Patent: Oct. 14, 2025

(54) ELECTRONIC COMPONENT-MOUNTING SUBSTRATE AND ELECTRONIC DEVICE

(71) Applicants: artience Co., Ltd., Tokyo (JP); TOYOCHEM CO., LTD., Tokyo (JP)

(72) Inventors: Tamaki Matsuo, Chuo-ku (JP); Kazunori Matsudo, Chuo-ku (JP); Kenji Ando, Chuo-ku (JP); Wataru Endo, Chuo-ku (JP)

(73) Assignees: artience Co., Ltd., Tokyo (JP); TOYOCHEM CO., LTD., Tokyo (JP)

( * ) Notice: Subject to any disclaimer, the term of this patent is extended or adjusted under 35 U.S.C. 154(b) by 0 days.

(21) Appl. No.: 18/880,591

(22) PCT Filed: Mar. 27, 2024

(86) PCT No.: PCT/JP2024/012467
§ 371 (c)(1),
(2) Date: Feb. 26, 2025

(87) PCT Pub. No.: WO2025/115245
PCT Pub. Date: Jun. 5, 2025

(30) Foreign Application Priority Data

Nov. 30, 2023 (JP) ................. 2023-202349

(51) Int. Cl.
*H01L 23/00* (2006.01)
*B32B 7/06* (2019.01)

(52) U.S. Cl.
CPC .............. *H01L 23/562* (2013.01); *B32B 7/06* (2013.01); *B32B 2307/7376* (2023.05); *B32B 2457/14* (2013.01)

(58) Field of Classification Search
CPC .......................... B32B 2457/14; H01L 23/562
See application file for complete search history.

(56) References Cited

U.S. PATENT DOCUMENTS

2021/0251111 A1* 8/2021 Mori .................... H05K 9/0092

FOREIGN PATENT DOCUMENTS

JP 2021004314 A 1/2021

OTHER PUBLICATIONS

Decision to Grant a Patent issued on Feb. 20, 2024, in corresponding Japanese Application No. 2023-202349; 5 pages.

* cited by examiner

*Primary Examiner* — Zachary M Davis
(74) *Attorney, Agent, or Firm* — Maier & Maier, PLLC

(57) ABSTRACT

An electronic component-mounting substrate including a peeling or falling prevention layer that has excellent adhesion and scratch resistance, can increase smoothness of corner parts of components after processing, and firmly covers a substrate and electronic components provided on the substrate, so that the electronic component-mounting substrate can prevent human nails or other components from getting caught between electronic components that are mounted during a process of mounting the electronic components, preventing the electronic components from peeling off or falling off from the substrate due to an external damage. The electronic component-mounting substrate includes a substrate, an electronic component, and a peeling or falling prevention layer, in which the peeling or falling prevention layer satisfies (1) a rate of change X of a coefficient of static friction is −50% or greater and 200% or smaller, and (2) an index Y is 0.8 or greater and 20.0 or smaller.

8 Claims, 4 Drawing Sheets

ELECTRONIC COMPONENT-MOUNTING SUBSTRATE AND ELECTRONIC DEVICE

TECHNICAL FIELD

The present disclosure relates to an electronic component-mounting substrate and an electronic device.

BACKGROUND

Since terminal-based electronic devices such as smartphones or wearable devices are used in a large variety of environments, it is required that they be highly reliable so that they do not malfunction even under harsh conditions. Furthermore, as electronic devices have become smaller in size and lower in height, sizes of electronic component-mounting substrates to be used have also become smaller, so that in turn a contact area between the substrates and the electronic components has become smaller. In accordance therewith, adhesion between the electronic components and the substrates has decreased, which highly increases a possibility of the electronic components peeling off or falling off from the substrates. Therefore, it is further required that electronic components be prevented from being damaged or peeling or falling off from substrates due to a physical damage, heat, and humidity.

A method for protecting electronic components such as IC chips and MLCCs (multilayer ceramic capacitors) from external damage by filling these electronic components with a resin layer has been known (Japanese Unexamined Patent Application Publication No. 2021-004314).

However, in order to reduce the height of the electronic component-mounting substrate and reduce costs, it is required to form a thinner protective layer after processing.

SUMMARY

As described above, the invention related to the electronic component-mounting substrate that is coated and protected is disclosed. However, when the thickness of the protective layer is reduced, a lot of problems described below may occur. It is therefore required to provide an electronic component-mounting substrate capable of solving all these problems.

The process of assembling each of the electronic devices includes a number of work processes during which a variety of electronic components are mounted on a substrate using solder or adhesive. After the electronic component-mounting substrate is obtained, an electronic device in which this substrate has been included has been assembled, and the substrate undergoes a reliability test and other processes. During these work processes, it is possible that the electronic components may peel off or fall off from the substrate or their positions may be deviated due to human nails or other components getting caught between the mounted electronic components. Further, in recent years, electronic components such as multilayer ceramic capacitors (hereinafter referred to as MLCCs) have rapidly become smaller in size and lower in height, and thus a contact area between the substrate and the electronic components has become smaller in accordance with this reduction in size and height, causing a reduced adhesion between the components and the substrate. It has therefore become more important to prevent the electronic components from peeling or falling off.

Further, a protective member having high friction resistance and scratch resistance that can withstand contact between a hard material such as metal and the electronic components or rubbing between them has been required. In addition, a highly reliable electronic component-mounting substrate whose protective member is not peeled off even after long-term use in a high temperature and high humidity environment has been required.

An object of the present disclosure is to provide a highly-reliable electronic component-mounting substrate reduced in size and height and having excellent abrasion resistance and scratch resistance in which electronic components are unlikely to peel off or fall off due to an external damage and which can be used for a long period of time in a high temperature and high humidity environment.

As a result of our thorough research, the present inventors have found that the problems may be solved by using an article having the following features (an electronic component-mounting substrate, a peeling or falling prevention layer, and a peeling or falling prevention sheet) and have arrived at the present disclosure. That is, the present disclosure relates to an electronic component-mounting substrate, a peeling or falling prevention layer, and a peeling or falling prevention sheet having the following features.

[1]: An electronic component-mounting substrate including: a substrate; an electronic component mounted on at least one surface of the substrate; and a peeling or falling prevention layer that coats the substrate and the electronic component, in which the peeling or falling prevention satisfies both the following (1) and (2).

(1) A rate of change X of a coefficient of static friction obtained in the following [Formula 1] is −50% or greater and 200% or smaller.

$$X = (\mu k_{300} - \mu k_{100})/\mu k_{100} \times 100 \qquad \text{[Formula 1]}$$

($\mu k_{100}$; a coefficient of static friction at a 100-th reciprocating wear test of the peeling or falling prevention layer, $\mu k_{300}$; a coefficient of static friction at a 300-th reciprocating wear test of the peeling or falling prevention layer)

(2) An index Y obtained in the following [Formula 2] is 0.8 or greater and 20.0 or smaller.

$$Y = R_2/(R_1 + A_1) \qquad \text{[Formula 2]}$$

($R_1$; a radius of curvature of a curved surface of a corner part of the electronic component in a cross section of the electronic component-mounting substrate, $R_2$; a radius of curvature of a corner part of the peeling or falling prevention layer in the cross section of the electronic component-mounting substrate, $A_1$; a thickness of the corner part of the peeling or falling prevention layer in the cross section of the electronic component-mounting substrate)

[2]: The electronic component-mounting substrate according to [1], in which the peeling or falling prevention layer includes a binder (A) and a filler (B), and a product of a BET specific surface area [m²/g] of the filler (B) and a content rate [mass %] of the filler (B) in 100 mass % of the peeling or falling prevention layer is 0.01 to 15 [mass %·m²/g].

[3]: The electronic component-mounting substrate according to [1] or [2], in which a thickness $A_2$ of the peeling or falling prevention layer is 5 to 300 μm.

[4]: An electronic device on which the electronic component-mounting substrate according to any one of [1] to [3] is mounted.

According to the present disclosure, it is possible to provide an electronic component-mounting substrate reduced in size and height in which electronic components are prevented from peeling or falling off due to an external damage for a long period of time, and an electronic device on which the electronic component-mounting substrate is mounted.

DETAILED DESCRIPTION OF EMBODIMENTS

Hereinafter, the present disclosure will be described with embodiments of the present disclosure. However, the following embodiments are not intended to limit the disclosure set forth in the claims. Further, all the combinations of the features described in the embodiments are not always essential for means for solving the problem.

<<Electronic Component-Mounting Substrate>>

Figure 1:
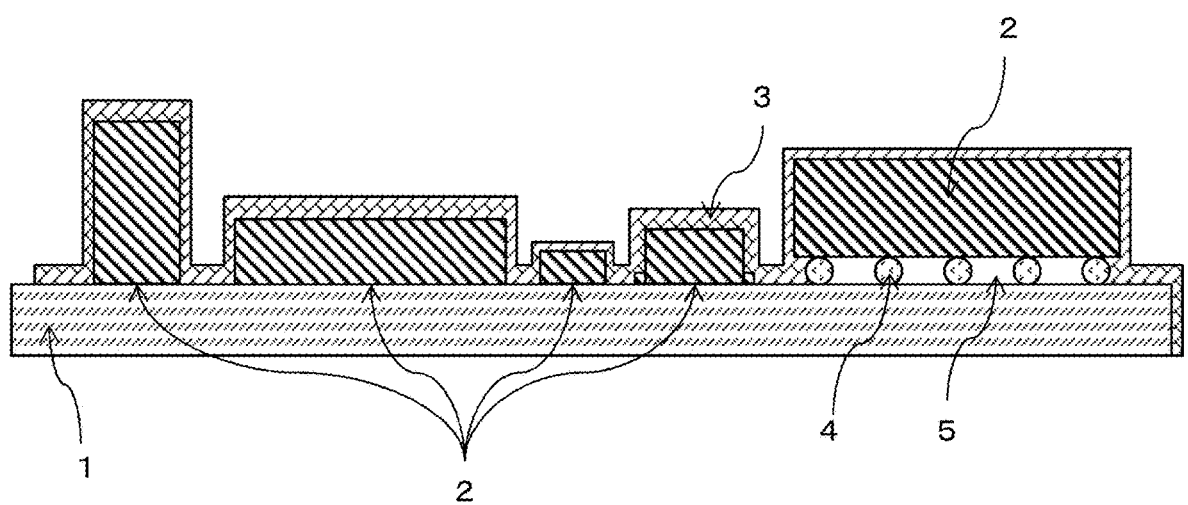
FIG. 1 is a schematic cross-sectional view of an electronic component-mounting substrate according to this embodiment.

As shown in FIG. 1, an electronic component-mounting substrate 10 according to the present disclosure includes a substrate 1, electronic components 2 mounted on the substrate 1, and a peeling or falling prevention layer 3 that coats and protects the substrate 1 and the electronic components 2. The substrate 1 or the electronic components 2 have a region including resin components (not shown), and the peeling or falling prevention layer 3 coats the surface thereof.

It is sufficient that the substrate 1 be the one on which the electronic components 2 can be mounted and which can withstand molding processes for various applications, and the substrate 1 may be arbitrarily selected. Electrode/wiring patterns, vias (not shown) and the like can be arbitrarily provided in the substrate 1. The substrate 1 may have rigidity or flexibility. The substrate 1 may be, for example, a work board, a mounted module substrate, a printed wiring board, on which conductive patterns made of a copper foil or the like are formed on their surface and/or inside, or a build-up substrate formed by a build-up method or the like.

The electronic components 2 may each be, for example, a connector, a film capacitor, a component such as IC chip in which a wafer or a wire is molded, an inductor, a thermistor, an MLCC, a coil, a diode, an electrolytic capacitor, a crystal oscillator, or the like. Among them, the MLCC and the IC chip are preferably applied to the present disclosure as the electronic components 2 because their sizes are small.

When a plurality of electronic components 2 are mounted, the respective shapes and heights may be the same or may be different from each other.

While the size and the height of the electronic components 2 are not particularly limited, the height thereof is preferably 3 mm or less due to the recent trend for the reduction in size and height. The IC chip may have, other than a rectangular shape, a cylindrical shape, a coin shape, a thin film shape, or the like. The MLCC is preferably 0402 (length: 0.4 mm, width: 0.2 mm) or 0603 (length: 0.6 mm, width: 0.3 mm), which are main package sizes, but other larger ones such as 1005 or 1608 may instead be mounted. The shape of the inductor includes a solenoid, a dome-shaped coil, a flat-plate coil, or the like. The shape of the thermistor includes rectangular, columnar, a lead type, or the like for surface mounting.

The electronic component 2 may be electrically connected to the substrate via a solder bump 4, and a connection terminal extended from the electronic component and the substrate may be directly connected to each other. When the electronic component 2 is connected to the substrate 1 via the solder bump 4, there is a hollow part 5 between the electronic component 2 and the substrate 1, as shown in FIG. 1.

The peeling or falling prevention layer 3 may coat and protect the electronic components 2 and the substrate 1 so as to maintain the hollow part 5, or may coat and protect them so as to fill the hollow part 5.

The peeling or falling prevention layer 3 can be manufactured by a method that will be described later.

The peeling or falling prevention layer 3 coats the substrate 1 and the electronic components 2. In FIG. 1, the upper surface and the side surface of the electronic components 2, and the whole surface of the substrate 1 or a part of an end surface thereof are coated with the peeling or falling prevention layer 3. That is, a coating layer (peeling or falling prevention layer 3) that coats the electronic components 2 to follow step parts (concave-convex parts) formed by the mounting of the electronic components 2 is provided. The peeling or falling prevention layer 3 is formed using a peeling or falling prevention sheet (reference numeral 6 in FIG. 3), which is a precursor of the peeling or falling prevention layer 3. The method for forming the peeling or falling prevention layer 3 from the peeling or falling prevention sheet 6 is not limited, but is preferably any one of press molding, Three dimension Overlay Method (TOM) molding, which is a three-dimensional surface coating method, vacuum molding, pressure molding, vacuum pressure molding, or injection molding. Among them, press molding is particularly preferable as a method for forming the peeling or falling prevention layer 3 from the peeling or falling prevention sheet 6.

While the example in which the electronic components 2 are mounted on one of the surfaces of the substrate 1 has been described in the example shown in FIG. 1, the electronic components 2 may be mounted on both surfaces of the substrate 1 and both surfaces of the substrate 1 may be coated with the peeling or falling prevention layer 3. In this manner, in the electronic component-mounting substrate according to the present disclosure, the electronic components 2 may be mounted on at least one of the surfaces of the substrate 1 and the peeling or falling prevention layer 3 that coats the substrate 1 and these electronic components 2 may be provided.

<<Peeling or Falling Prevention Layer>>

Next, the peeling or falling prevention layer according to the present disclosure will be described in further detail. As described above, the peeling or falling prevention layer 3 is provided to prevent the group of electronic components 2 arranged on the substrate 1 from peeling off or falling off from the mounting substrate 1.

The peeling or falling prevention layer 3 satisfies both the following (1) and (2).

(1) A rate of change X of a coefficient of static friction obtained in the following [Formula 1] is −50% or greater and 200% or smaller.
(2) An index Y obtained in the following [Formula 2] is 0.8 or greater and 20.0 or smaller.

These numerical values X and Y are values calculated in the following [Formula 1] and [Formula 2], and X and Y are measured according to methods and conditions in Examples that will be described later.

<<Rate of Change X of Coefficient of Static Friction>>

The rate of change X of the coefficient of static friction obtained by a reciprocating wear test of the peeling or falling prevention layer (hereinafter, the rate of change X of the coefficient of static friction) can be expressed by the following [Formula 1].

$$X=(\mu k_{300}-\mu k_{100})/\mu k_{100} \times 100 \quad \text{[Formula 1]}$$

Here, $\mu k_{100}$ is a coefficient of static friction at the 100-th reciprocating wear test of the peeling or falling prevention layer and $\mu k_{300}$ is a coefficient of static friction at the 300-th reciprocating wear test of the peeling or falling prevention layer.

The above method for measuring the coefficients of static friction $\mu k_{100}$ and $\mu k_{300}$ will be described in detail in Examples.

The rate of change X of the coefficient of static friction is obtained by comparing the number of times when the coefficient of static friction is stable at the time of measurement as a result of testing performed using a wear tester is compared with the number of times serving as criterion for determining the presence or absence of abrasion resistance. Therefore, the rate of change X of the coefficient of static friction is calculated using the coefficient of static friction $\mu k_{100}$ at the 100-th reciprocating wear test, and the coefficient of static friction $\mu k_{300}$ at the 300-th reciprocating wear test which is an index indicating the presence or absence of abrasion resistance. The rate of change X of the coefficient of static friction is an index to confirm the state in which a constant coefficient of static friction is maintained when the reciprocating wear test is continued, that is, an index for checking abrasion resistance. Further, a positive value for the rate of change X of the coefficient of static friction indicates a progress of wear, and the larger the value is, the lower the abrasion resistance is. A negative value indicates less wear progress and more slippage on the surface of the peeling or falling prevention layer. This is considered to be influenced by the filler exposed when the film surface is scraped or abrasion powder on the surface of the peeling or falling prevention layer, or frictional heat.

Note that the above test by the wear tester is performed on a smooth surface of the peeling or falling prevention layer formed on the resin-containing area of the electronic components or the base from the viewpoint of obtaining stable measurement values. The resin region indicates the part where the surface is covered with resin, such as mold resin or glass epoxy resin.

The rate of change X of the coefficient of static friction in the present disclosure is −50% or greater and 200% or smaller, so that the abrasion resistance of the peeling or falling prevention layer on the electronic component-mounting substrate can be improved. X is preferably −25% or greater and 150% or smaller, and more preferably −5% or greater and 100% or smaller. By setting the rate of change X on the peeling or falling prevention layer to be in the above range, the peeling or falling prevention layer is less likely to be scratched, and abrasion resistance and scratch resistance are improved.

[Control Method]

A method for controlling the rate of change X of the coefficient of static friction of the peeling or falling prevention layer may be any method including a well-known method. For example, a method for improving resistance to friction by hardening the surface of the peeling or falling prevention layer by adjusting compositions added to the peeling or falling prevention layer, a method for improving slipperiness of an oil-supplement surface by adding wax components or the like to the peeling or falling prevention layer, a method for reducing surface irregularities by reducing the particulate components to be added or changing the shape thereof (reduction of the friction coefficient of the surface), a method for improving the heat-resisting property of the peeling or falling prevention layer, or a method for reducing surface irregularities by the type of a protective film used to form the peeling or falling prevention sheet, which serves as a precursor of the peeling or falling prevention layer, on the electronic component-mounting substrate may be employed. While the method for controlling the abrasion resistance of the surface of the peeling or falling prevention layer is not limited to the illustrated ones, the method for hardening the surface by increasing the amount of curing agent in the peeling or falling prevention layer or the method for reducing surface irregularities by adjusting the amount and shape of particulate materials in the peeling or falling prevention layer is preferable from the viewpoint of productivity since no pre/post treatment is required.

<<Index Y>>

The peeling or falling prevention layer according to the present disclosure has an index Y, which is obtained from the following [Formula 2], of 0.8 or greater and 20.0 or smaller. By setting the value to be within the above numerical range, the surface of the electronic component-mounting substrate can be smoothly coated and an appropriate shape that can prevent electronic components from peeling or falling off can be obtained.

From the viewpoint of uniformity of the thickness of the peeling or falling prevention layer (ability to follow parts) and securing of the thickness of the corner parts of the electronic components, Y is preferably 0.9 or greater and 12.0, and more preferably, 1.0 or greater and 5.0 or smaller.

$$Y=R_2/(R_1+A_1) \quad \text{[Formula 2]}$$

Figure 2:
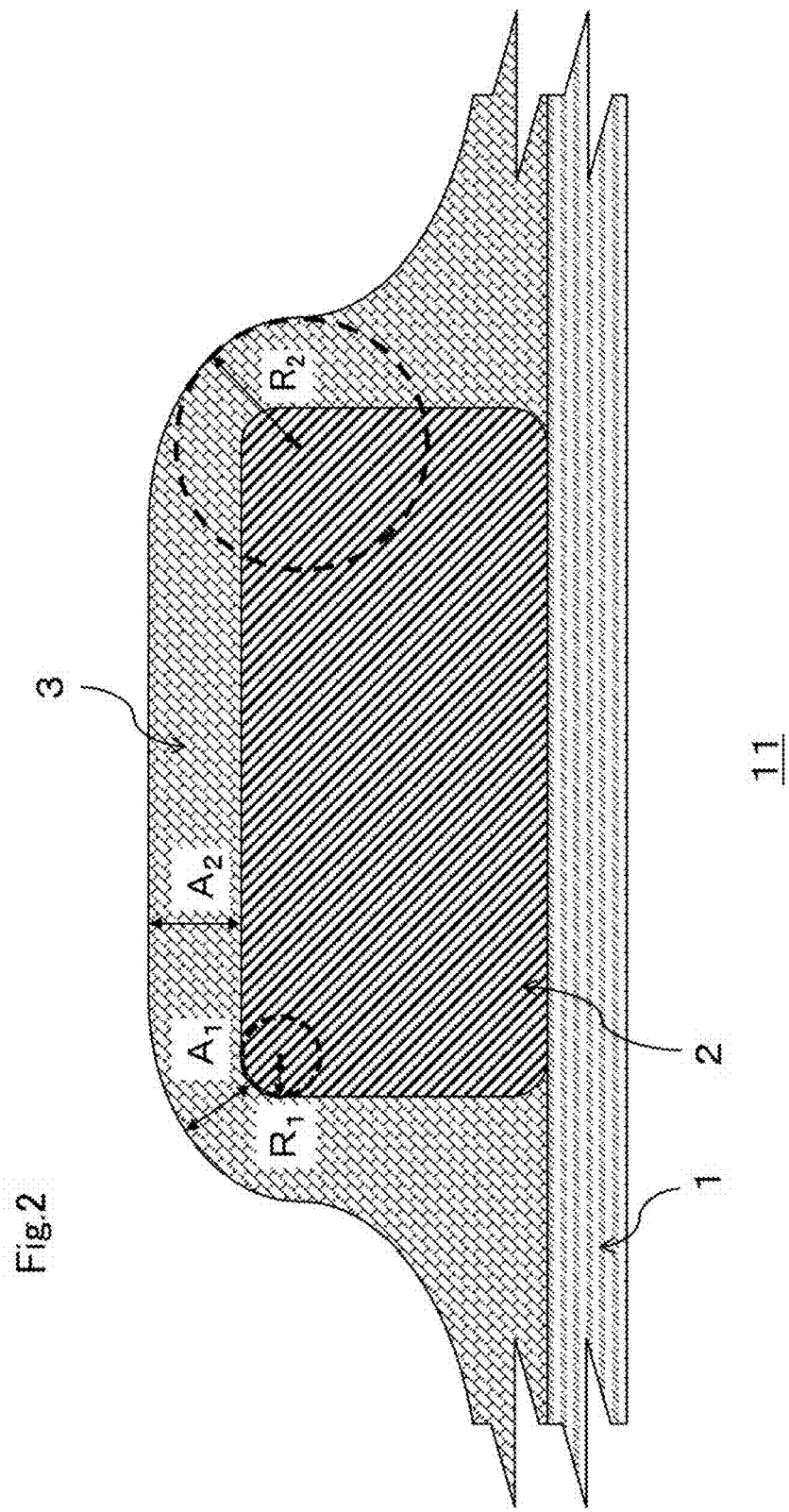
FIG. 2 is a schematic cross-sectional view of the electronic component-mounting substrate according to this embodiment in which $R_1$, $R_2$, and $A_1$ on a curved surface of a corner part of electronic components forming an index Y are clarified.

Note that $R_2$, $R_1$, and $A_1$ in [Formula 2] are obtained from measured values of the cross section taken along the line perpendicular to the substrate surface of the electronic component-mounting substrate 11 shown in FIG. 2, in which a radius of curvature of the curved surface of the corner part of the electronic component 2 in the cross section of the electronic component-mounting substrate 11 is denoted by $R_1$, a radius of curvature of the corner part of the peeling or falling prevention layer 3 in the cross section of the electronic component-mounting substrate 11 mounted thereon is denoted by $R_2$, and the thickness of the corner part of the peeling or falling prevention layer 3 in the cross section of the electronic component-mounting substrate 11 is denoted by $A_1$ (hereinafter referred to as a thickness $A_1$ of the corner part of the peeling or falling prevention layer).

The cross section of the electronic component-mounting substrate 11 may be exposed by dicing or by using a polishing method, and this cross section is measured by using, for example, a digital microscope VHX-7000 (manufactured by KEYENCE CORPORATION), whereby $R_2$, $R_1$, $A_1$ can be obtained.

The radii of curvature $R_1$ and $R_2$, which indicate parts of each corner part where nails or other components are most likely to be caught, indicate the radii of curvature which become minimum values at the time of measuring at each corner part.

The index Y is a value representing the change in smoothness between the corner part of the electronic component 2 and the corner part of the peeling or falling prevention layer 3 on the electronic component. By setting the index Y to be within the above range, it is possible to prevent the electronic components 2 from peeling off or falling off, which is due to nails or other components being caught between the electronic components 2, which occurs during the test of the electronic component-mounting substrate 11 or at a time when the electronic component-mounting substrate 11 is mounted on an electronic device in a later process.

The index Y can be controlled by adjusting the ability of the peeling or falling prevention sheet 6 to follow the electronic components 2 during processing and fluidity of the peeling or falling prevention sheet 6. Specifically, a method for adjusting the followability and fluidity by selecting the binder (A) and the filler (B) that constitute the peeling or falling prevention sheet 6 described later, a method for adjusting the ability of the peeling or falling prevention sheet 6 to follow the substrate 1 and the electronic components 2 by adjusting the processing conditions when the peeling or falling prevention sheet 6 is processed (processing temperature, processing time, pressurization conditions, degree of vacuum, or the like), and a method for controlling the fluidity of the peeling or falling prevention sheet 6 by changing the configuration of the laminate when the peeling or falling prevention sheet 6 is processed. When a plurality of peeling or falling prevention sheets 6 are used, different respective methods may be applied or a common method may be applied.

<<Binder (A)>>

The peeling or falling prevention layer 3 includes a binder (A). The binder (A), which is a base of the peeling or falling prevention layer, has a function of supporting the filler (B) that will be described later and other optional components. The binder (A) may be one of a thermoplastic resin, or a thermosetting resin and a curable compound.

[Thermoplastic Resin]

Examples of the thermoplastic resin may include polyolefin resins, vinyl resins, styrene acrylic resins, diene resins, terpene resins, petroleum resins, cellulose resins, polyamide resins, polyurethane resins, polyester resins, polycarbonate resins, polyimide resins, liquid crystal polymer, fluorine resins or the like. More specifically, from the viewpoint of heat-resisting property, the thermoplastic resin may be, but not specially limited thereto, polyamide resins, polyurethane resins, polyester resins, polycarbonate resins, polyimide resins, liquid crystal polymer, or fluorine resins.

As the thermoplastic resin, one kind may be used alone or two or more kinds of resins may be used in combination.

[Thermosetting Resin]

The thermosetting resin is a resin which has a plurality of functional groups that can react with a curable compound. The functional groups may be, for example, a hydroxyl group, a phenolic hydroxyl group, an acid anhydride group, a methoxymethyl group, a carboxyl group, an amino group, an epoxy group, an oxetanyl group, an oxazoline group, an oxazine group, an aziridine group, a thiol group, an isocyanate group, a blocked isocyanate group, a blocked carboxyl group, a silanol group, or the like. The thermosetting resin may be, for example, known resins such as acrylic resins, maleic resins, polybutadiene resins, polyester resins, polyurethane resins, polyurethane urea resins, epoxy resins, oxetane resins, phenoxy resins, polyimide resins, polyamide resins, polyamide-imide resins, phenolic resins, alkyd resins, amino resins, polylactic acid resins, oxazoline resins, benzoxazine resins, silicone resins, fluororesins, or the like.

Regarding the thermosetting resin, one kind may be used alone or two or more kinds of resins may be used in combination.

Among them, in view of the heat-resisting property, the thermosetting resin is preferably polyurethane resins, polyurethane-urea resins, polyester resins, epoxy resins, phenoxy resins, polyimide resins, polyamide resins, or polyamide-imide resins.

[Curable Compound]

The curable compound includes a plurality of functional groups that can be reacted with a functional group of the thermosetting resin. Examples of the curable compound may include epoxy compounds, acid anhydride group-containing compounds, isocyanate compounds, aziridine compounds, amine compounds, phenol compounds, organometallic compounds, or the like.

As the curable compound, one kind may be used alone or two or more kinds of compounds may be used together.

The curable compound preferably contains bi-functional or higher-functional curable compound, and more preferably contains a tri-functional or higher-functional curable compound. From the viewpoint of adjusting the crosslink density and achieving both processing suitability during the molding of the electronic component-mounting substrate that will be described later and stability over time of the composition, which is a precursor of the peeling or falling prevention sheet, it is desirable to use a combination of a bi-functional curable compound with a tri-functional or higher-functional curable compound.

By adjusting the content amount of the curable compound as described later, a strong cross-linked structure is formed in the peeling or falling prevention layer, whereby adhesion between the peeling or falling prevention layer and the base can be improved and reliability is improved. In this manner, the adhesion between the peeling or falling prevention layer and the base can also be adjusted by the content amount of the curable compound in the composition.

1 to 50 pts.mass of each kind of the bi-functional curable compound are preferably included with respect to the 100 pts.mass of the thermosetting resin, and 15 to 30 pts.mass are more preferable. By setting the amount of bi-functional curable compound to be 1 pts.mass or greater, a stronger cross-linked structure may be formed in the peeling or falling prevention layer and resistance to thermal damage is further improved. Further, by setting the amount of bi-functional curable compound to be 15 pts.mass or greater, the hardness and the strength of the surface of the peeling or falling prevention layer can be adjusted and abrasion resistance can be further improved. On the other hand, by setting the amount of curable compound to 50 pts.mass or smaller, it is possible to easily prevent excessive hardening of the peeling or falling prevention layer and easily prevent cracking due to shrinkage of the peeling or falling prevention sheet after being cured.

0.2 to 20 pts.mass of each kind of the tri-functional or higher-functional curable compound are preferably included with respect to 100 pts.mass of the thermosetting resin, 0.3 to 5 pts.mass are more preferable, and 0.8 to 3 pts.mass are further preferable. By setting the amount of tri-functional or higher-functional curable compound to be 0.2 pts.mass or greater, the adhesion between the peeling or falling prevention layer and the base is further improved and reliability can be further improved.

Further, by setting the amount of tri-functional or higher-functional curable compound to be 20 pts.mass or smaller, at the time of heating and pressurizing in a process for manufacturing the electronic component-mounting substrate that will be described later, the peeling or falling prevention sheet 6 can be easily deformed so as to follow the shape of the electronic components 2, whereby a non-defective peeling or falling prevention layer can be easily formed.
[Lubricants]

The peeling or falling prevention layer 3 may contain lubricants such as wax. By adding them, the surface of the peeling or falling prevention layer becomes more slippery and the abrasion resistance can be easily improved. Since the surface of the peeling or falling prevention layer is less likely to crack, it can be expected that reliability will be further improved. As the waxes, for example, animal and plants waxes such as beeswax, lanolin wax, whale wax, candelilla wax, carnauba wax, rice wax, wood wax, jojoba oil, palm oil or the like; mineral and petroleum waxes such as montan wax, ozogelite, ceresin, paraffin wax, microcrystalline wax, petrolatum or the like; or synthetic waxes such as Fischer-Tropsch wax, polyethylene wax, polyethylene oxide wax, polypropylene oxide wax, montan wax derivatives, paraffin wax derivatives, microcrystalline wax derivatives, Teflon (registered trademark) wax or the like.
<<Filler (B)>>

The peeling or falling prevention layer 3 includes a filler (B). By changing the type, the average particle diameter, and the amount of the filler (B) as necessary, the index Y and the rate of change X of the coefficient of static friction can be controlled. Further, it is possible to adjust the cohesive force in the peeling or falling prevention layer 3, and mechanical properties such as a maximum point stress T can fall within a good range.

An insulating filler is used when insulating properties are required, a conductive filler is used when conductivity is required, and an electromagnetic wave absorption filler is used when electromagnetic wave absorption properties are required. The shape of the filler can be selected as appropriate. The filler may be, for example, a flaky, acicular, spherical, dendritic, or fibrous filler. Fillers of different shapes may be used in combination with each other. Preferred examples may include a combination of spherical fillers whose average particle diameters are different from each other by a factor of 10 or more, or a combination of a flaky filler and a dendritic filler.

Examples of the insulating filler include non-metal inorganic fillers such as silica, alumina, boron nitride, aluminum nitride, silicon magnesium nitride, silicon carbide, titania, glass, and ceramic. The insulating filler may be used alone or may be used in combination of two or more kinds thereof.

The conductive filler may be, for example, a metal filler, a conductive ceramics filler, and a mixture thereof. The metal filler may be, for example, a core-shell type filler of a metal powder such as gold, silver, copper and nickel, an alloy powder such as solder, a silver-coated copper powder, a gold-coated copper powder, a silver-coated nickel powder, or a gold-coated nickel powder. From the viewpoint of obtaining excellent conductive properties, a conductive filler that contains silver is preferably used. From the perspective of reducing the cost, a silver-coated copper powder is particularly preferable.

The electromagnetic wave absorption filler may be, for example, iron, iron alloy such as Fe—Ni alloy, Fe—Co alloy, Fe—Cr alloy, Fe—Si alloy, Fe—Al alloy, Fe—Cr—Si alloy, Fe—Cr—Al alloy, or Fe—Si—Al alloy, a ferrite material such as Mg—Zn ferrite, Mn—Zn ferrite, Mn—Mg ferrite, Cu—Zn ferrite, Mg—Mn—Sr ferrite, Ni—Zn ferrite or the like, and a carbon filler. The carbon filler may be, for example, a filler made of acetylene black, ketjen black, furnace black, carbon black, carbon fibers, or carbon nanotubes, a graphene filler, a graphite filler, and carbon nanowalls.

The average particle diameter of the filler (B) is preferably 0.005 to 50 μm. More preferably, from the viewpoint of maintaining smoothness of the surface of the peeling or falling prevention layer, reducing the effect of abrasion powder when the peeling or falling prevention layer is worn, and improving abrasion resistance, the average particle diameter of the filler (B) is from 0.02 to 20 μm.

The content rate of the filler (B) in 100 mass % of the peeling or falling prevention layer is preferably 0.1 to 80 mass %. More preferably, from the viewpoint of improving surface characteristics and scratch resistance while preventing the filler (B) from peeling off or falling off from the surface of the peeling or falling prevention layer, the content rate of the filler (B) is 1.0 to 35 mass %. When the content amount of the filler (B) is 80 mass % or smaller, the abrasion resistance is further improved.

A product of the BET specific surface area [$m^2/g$] of the filler (B) in the peeling or falling prevention layer and the content rate [mass %] of the filler (B) in 100 mass % of the peeling or falling prevention layer (hereinafter, a product of the specific surface area and the content rate) is preferably from 0.01 to 15, and more preferably from 0.1 to 10. When two or more types of filler (B) are used, the product of the specific surface area and the content rate is a total sum of the products of the specific surface area and the content rate required for various kinds of fillers (B) included in the peeling or falling prevention layer.

When the product of the specific surface area and the content rate is within the above range, the filler (B) functions as a reinforcement material in the peeling or falling prevention sheet, whereby it is possible to easily prevent the peeling or falling prevention sheet 6 from being broken at the time of heating and pressurizing in a process for manufacturing the electronic component-mounting substrate that will be described later and to easily form a peeling or falling prevention layer without defect.

Further, when the product of the specific surface area and the content amount is 15 or less, the adhesion of the peeling or falling prevention layer to the base and the electronic components is further secured so that it is possible to easily optimize the scratch resistance and the peeling or falling prevention properties.

The BET specific surface area [$m^2/g$] of the filler (B) is preferably 0.1 to 150.

The peeling or falling prevention sheet 6 may include a flexibility modifier. As the flexibility modifier is included, wrinkles or tearing of the peeling or falling prevention sheet 6 during the process of forming the peeling or falling prevention sheet 6 can be easily improved. Examples of the flexibility modifier may include plasticizer, inactive thermoplastic resins that are themselves scientifically non-reactive.

Examples of the plasticizer may include fatty acid ester, phthalic acid ester, aromatic polycarboxylic acid ester, or polyester.

Examples of the fatty acid ester may include Trioctyl trimellitate (TOTM), manufactured by Mitsubishi Gas Chemical Trading, Inc., butyl stearate, UNISTER M-9676, UNISTER M-2222SL, UNISTER H-476, UNISTER H-476D, PANACET 800B, PANACET 875, PANACET 810 (product names, manufactured by NOF Corporation), DBA, DIBA, DBS, DOA, DINA, DIDA, DOS, BXA, DOZ, DESU (product names, manufactured by Daihachi Chemical Industry Co., Ltd.).

Examples of the phthalic acid ester may include DMP, DEP, DBP, #10, BBP, DOP, DINP, DIDP (product names, manufactured by Daihachi Chemical Industry Co., Ltd.), PL-200, DOIP (product names, manufactured by CG ESTER Corporation), SANSO CIZER DUP (product name, manufactured by New Japan Chemical Co., Ltd.).

Examples of the aromatic polycarboxylic acid ester may include TOTM (product name, manufactured by Daihachi Chemical Industry Co., Ltd.), MONOCIZER W-705 (product name, manufactured by Daihachi Chemical Industry Co., Ltd.), UL-80, UL-100 (product names, manufactured by ADEKA).

Examples of polyester may include POLYCIZER TD-1720, POLYCIZER S-2002, POLYCIZER S-2010 (product names, manufactured by DIC), BAA-15 (product name, manufactured by Daihachi Chemical Industry Co., Ltd.).

Among them, DMP, DEP, DBP, DOP, DINP, DIDP, TOTM (product names) are more preferable. As the plasticizer, one kind may be used alone or two or more kinds may be used in combination.

The inactive thermoplastic resins may be polyolefin resins, vinyl resins, styrene acrylic resins, diene resins, terpene resins, petroleum resins, cellulose resins, polyamide resins, polyurethane resins, polyester resins, polycarbonate resins, polyimide resins, liquid crystal polymer, fluorine resins or the like. More preferably, from the viewpoint of heat-resisting property, the inactive thermoplastic resins may be, but not specially limited thereto, polyamide resins, polyurethane resins, polyester resins, polycarbonate resins, polyimide resins, liquid crystal polymer, and fluorine resins.

Further, the peeling or falling prevention sheet 6 may include tackifying resins for improving adhesion between the substrate 1 and the electronic components 2. The tackifying resins, which are components for supplementally improving adhesion, have a weight average molecular weight of less than 5,000. The tackifying resins are distinguished from the above thermoplastic resins and binders. Examples of the tackifying resins may include rosin resins, terpene resins, alicyclic petroleum resins, and aromatic petroleum resins.

The peeling or falling prevention sheet 6 may further include colorants, UV coloring agents, flame retardants, lubricants, anti-blocking agents or the like.

Examples of the colorants may be, for example, organic pigments, carbon black, ultramarine, red oxide, zinc oxide, titanium oxide, graphite, dye, or the like.

The UV coloring agents may be, for example, fluorescent pigments, fluorescent dyes, and phosphors.

The flame retardants may be, for example, halogen containing flame retardants, phosphorus-containing flame retardants, nitrogen-containing flame retardants, inorganic flame retardants or the like.

The lubricants may be, for example, fatty acid ester, a hydrocarbon resin, paraffin, higher fatty acid, fatty acid amide, aliphatic alcohol, a metal soap, modified silicone or the like.

The anti-blocking agents may be, for example, calcium carbonate, silica, polymethylsilsesquioxane, aluminum silicate or the like.

Further, as the additives, one kind may be used alone or two or more kinds may be used in combination.

<<Thickness $A_2$ of Peeling or Falling Prevention Layer>>

The thickness $A_2$ of the peeling or falling prevention layer 3 is preferably from 5 to 300 μm from the viewpoint of both peeling or falling prevention properties (abrasion resistance and scratch resistance) of the electronic components 2 and thinness, and more preferably from 15 to 200 μm. As shown in FIG. 2, the above thickness $A_2$ is a measured value of the thickest part formed on the upper surface area of the electronic components 2 in the cross-sectional image of the electronic components 2.

<<Maximum Point Stress T of Peeling or Falling Prevention Layer>>

The maximum point stress T of the peeling or falling prevention layer 3 is a value obtained by a tensile test that is in compliance with JIS K 7162. Specifically, the maximum point stress T of the peeling or falling prevention layer 3 is a stress T at the maximum when the peeling or falling prevention layer with an effective tensile size of 20×23 mm is pulled at 50 mm/min at atmosphere of 100° C. (in the atmosphere, 50% RH).

The maximum point stress T is preferably 1 MPa or greater and 100 MPa or smaller, and more preferably 15 MPa or greater and 40 MPa or smaller.

When the maximum point stress T is 1 MPa or higher, it is possible to further improve abrasion resistance and scratch resistance. On the other hand, when the maximum point stress T is 100 MPa or lower, the ability of the peeling or falling prevention sheet 6 to follow the electronic components 2 when the peeling or falling prevention layer is formed in the electronic components is further improved. Further, it is easy to prevent defects in appearance and processing, such as occurrence of a void between the peeling or falling prevention layer 3 and the substrate 1 or between the peeling or falling prevention layer 3 and the electronic components 2, or occurrence of peeling or falling of the electronic components 2 or breakage of the peeling or falling prevention layer 3 as fractures or cracks are likely to occur in the peeling or falling prevention layer 3.

The maximum point stress T of the peeling or falling prevention layer 3 may be adjusted by, for example, selecting the thermoplastic resin or thermosetting resin, the crosslink density in this peeling or falling prevention layer, and the filler. Regarding the crosslink density, a method of adjusting the number of functional groups and equivalent amount of curable compounds in the composition to form the peeling or falling prevention layer is preferable. While the filler may be selected based on factors such as the material, shape, size, surface condition, specific surface area, amount of filler added or the like, the filler is suitably selected based on the specific surface area of the filler and the amount of filler added.

<<Tg of Peeling or Falling Prevention Layer>>

Tg of the peeling or falling prevention layer 3 is a value measured using a dynamic viscoelasticity measurement device. When more than one Tg of the peeling or falling prevention layer can be seen, the one with the largest tanδ is shown. Tg of the peeling or falling prevention layer 3 is preferably 5° C. or higher but 180° C. or lower, and more preferably 20° C. or higher but 80° C. or lower. By setting Tg to be 5° C. or higher but 180° C. or lower and adjusting fluidity of the peeling or falling prevention layer, the peeling or falling prevention layer can be easily processed into an optimal shape and the index Y can be easily brought to an optimal range. Further, by setting this Tg to be 20° C. or higher but 80° C. or lower, it becomes easy to achieve both resistance to frictional heat due to abrasion and resistance to thermal damage during a test in a later process, whereby reliability can be further improved.

When the binder (A) includes a thermosetting resin, the maximum point stress T and Tg indicate those after heating and curing.

<<Peeling or Falling Prevention Sheet>>

Figure 3:
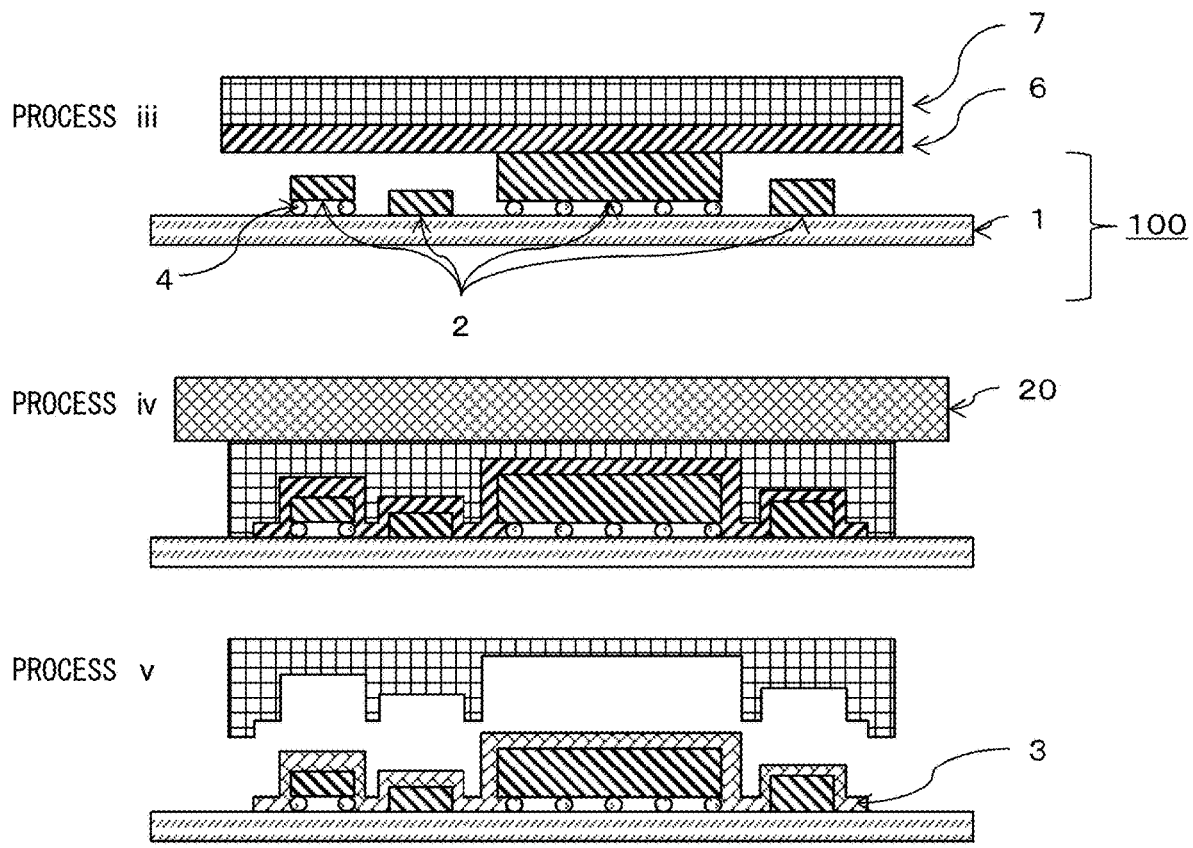
FIG. 3 is a diagram showing a part of a flow of a process for manufacturing the electronic component-mounting substrate according to this embodiment.

As shown in FIG. 3, the peeling or falling prevention sheet 6 is a precursor of the peeling or falling prevention layer 3. When the peeling or falling prevention sheet 6 includes a thermosetting resin, the peeling or falling prevention layer 3 can be obtained by heating the peeling or falling prevention sheet 6 for a time longer than a specified amount of time and at a temperature higher than a specified temperature to cause a curing reaction. The peeling or falling prevention sheet 6 may have a peelable sheet on one or both surfaces thereof for surface protection. Further, a cushion material 7 used in the coating protection process by the peeling or falling prevention sheet 6 described later may be laminated in advance.

<<Method of manufacturing Peeling or Falling Prevention Sheet>>

The method of manufacturing the peeling or falling prevention sheet 6 may be, for example, but not limited thereto, a method of applying a composition obtained by dissolving materials such as the above binder (A) forming the peeling or falling prevention layer 3 into a solvent or the like to a peelable sheet. The applying method may be, for example, a gravure coating method, a kiss coating method, a die coating method, a LIP coating method, a Comma Coating method, a blade method, a roll coating method, a knife coating method, a spray coating method, a bar coating method, a spin coating method, a dip coating method, various printing methods, or the like.

The peeling or falling prevention sheet 6 in the present disclosure may be a lamination of two or more peeling or falling prevention sheets in order to achieve a desired thickness. The structure laminated as described above may be formed of only a peeling or falling prevention sheet or may include a layer having a specific function as an intermediate layer.

<<Application of Peeling or Falling Prevention Sheet>>

The peeling or falling prevention sheet 6 according to the present disclosure can be suitably used to protect various substrates 1, that is, substrates such as a rigid substrate or an FPC substrate, and electronic components 2 that are mounted thereon.

Further, the peeling or falling prevention sheet 6 in the present disclosure exhibits sufficiently high adhesive strength for practical use regardless of whether the substrate 1 is metal, resin, fiber, ceramic, glass, or conductive silicone. The metal may be aluminum, copper, brass, stainless steel, iron, chrome, or the like. The resins may be epoxy resins, polyethylene terephthalate, polyimide, polyamide, polyethylene, polypropylene, polyolefin-based graft polymer, polystyrene, polyvinyl chloride, or the like. In this manner, the peeling or falling prevention sheet 6 can also be suitably used for adhesion between different materials with different polarities.

<<Method for manufacturing Electronic Component-Mounting Substrate>>

A method for manufacturing the electronic component-mounting substrate will be described.

In the method for manufacturing the electronic component-mounting substrate according to the present disclosure, by performing a process for mounting one or more electronic components 2 on a substrate 1 (Process i), a process for preparing a peeling or falling prevention sheet 6 (Process ii), a process for placing the peeling or falling prevention sheet 6 in such a way that the highest one of the electronic components 2 and the peeling or falling prevention sheet 6 contact each other (Process iii, also referred to as a temporary tensioning process), a process for deforming the peeling or falling prevention sheet 6 by heating and pressurizing in such a way that the shape of the peeling or falling prevention sheet 6 conforms to the shape of the individual electronic components 2 to coat at least a part of the electronic components 2 and the substrate 1 (Process iv), and a process for curing the deformed peeling or falling prevention sheet 6 in the deformed state to form a peeling or falling prevention layer 3 (Process v), the electronic component-mounting substrate can be coated and protected by the peeling or falling prevention layer 3 formed from the peeling or falling prevention sheet 6 in the present disclosure. Process iv and Process v may be a series of processes.

Hereinafter, with reference to FIG. 3, an example of a method for coating and protecting the electronic component-mounting substrate by heating and pressurizing using the peeling or falling prevention sheet 6 will be described in Processes iii-v.

(Process iii; Peeling or Falling Prevention Sheet Placement Process)

A mounting substrate 100 in which electronic components 2 are mounted on a substrate 1 directly or via a solder bump 4 is prepared. The electronic components 2 are each a semiconductor chip, a capacitor, a transistor, an inductor, a thermistor, or the like. The electronic components 2 may be mounted on the substrate 1 via the solder bump 4, and there may be a gap between the electronic components 2 and the substrate 1. Further, the electronic components 2 may have heights different from one another.

Next, a peeling or falling prevention sheet 6 that is cut into a predetermined size is placed on a mounting surface of the electronic components 2. The peeling or falling prevention sheet 6 contacts the highest one of the electronic components 2 and is temporarily bonded thereto. It is also possible that the peeling or falling prevention sheet 6 may bend and contact with another electronic component 2 (not shown in FIG. 3).

Note that a cushion material 7 may be laminated on the peeling or falling prevention sheet 6. FIG. 3 shows an example in which the cushion material 7 is used. The cushion material 7 may be laminated after the peeling or falling prevention sheet 6 is placed, or a laminate in which the peeling or falling prevention sheet 6 and the cushion material 7 overlap each other in advance may be placed. The above cushion material 7 is a material that is softened or melted at the time of heating and pressurizing, and functions to cause the peeling or falling prevention sheet 6 to follow the electronic components 2 and cause the peeling or falling prevention sheet 6 to follow the gaps between the electronic components 2.

The cushion material 7 is not particularly limited as long as it is a thermoplastic material, and preferably has a melting temperature lower than the temperature at the time of pressurization and a glass transition point (Tg). Preferred examples of the cushion material 7 may include a polyolefin film, a polyvinyl chloride film, and a PVA film. Depending on the depth of the grooves, the thickness of the cushion material 7 is generally about 100 μm to 1 mm. When a plurality of cushion materials 7 are laminated, the total thickness is preferably within this range.

Note that the electronic component-mounting substrate according to the present disclosure is only one example. The structures of the electronic components and the substrate are not particularly limited, and there may be or may not be gaps between the electronic components 2 and the substrate 1. The positions of the electronic components 2 to be mounted are not limited.

(Process iv; Process for Coating at Least Part of Electronic Components and Substrate)

Next, by performing heating and pressurizing by the heating and pressurizing machine 20, the peeling or falling prevention sheet 6 is deformed to conform to the shapes of the respective electronic components 2, that is, to conform to the upper surfaces and side surfaces of the electronic components 2, so that the peeling or falling prevention sheet 6 follows at least a part of the electronic components and the substrate 1. The cushion material 7 is softened or melted by heat, and causes the peeling or falling prevention sheet 6 to follow irregularities between electronic components of the mounting substrate 100.

At the time of heating and pressurizing, a peelable sheet (not shown) may preferably be provided between the heating and pressurizing machine 20 and the cushion material 7. The peelable sheet is a sheet obtained by performing known peeling processing on a base such as paper or plastic. Further, a plastic sheet with low polarity, such as Teflon (registered trademark), may be used.

It is sufficient that the heating temperature be a temperature at which the peeling or falling prevention sheet 6 is softened moderately, is deformed to conform to the shapes of the respective electronic components 2, and enter the gaps between the respective electronic components. The heating temperature is preferably from 100 to 260° C., and more preferably from 120 to 240° C. When the heating temperature is 100° C. or higher, it is possible to easily prevent entering properties of the peeling or falling prevention sheet 6 into the gaps between the respective electronic components that are mounted from being reduced. On the other hand, when the heating temperature is 260° C. or lower, heat curing reaction of the thermosetting resin of the peeling or falling prevention sheet 6 rapidly advances, whereby it is possible to easily prevent entering properties of the peeling or falling prevention sheet into the gaps between the electronic components that are mounted from being reduced.

The pressure at the time of heating and pressurizing is preferably from 0.01 to 15 MPa, and more preferably from 0.1 to 6.0 MPa. By performing heating and pressurizing at a pressure in this range, the embedding properties are further improved without the electronic components being damaged.

The heating time is normally from 0.5 to 30 minutes, and preferably from 1 to 20 minutes. When the heating time is 0.5 minutes or longer, it is possible to easily prevent entering properties of the peeling or falling prevention sheet 6 into the gaps between the respective electronic components that are mounted from being reduced. On the other hand, when the heating time is 30 minutes or shorter, thermal decomposition or oxidation of a thermosetting resin are likely to occur, whereby it is possible to easily prevent reliability of the adhered part from being decreased due to a reaction product or the like. The heating and pressurizing process is preferably performed under vacuum conditions.

As a method for performing heating and pressurizing, other than a method that uses a heating and pressurizing machine, a metal plate having an appropriate weight may be laminated to achieve a predetermined pressure and this laminated object may be input into an oven.

On the other hand, as a heating and pressurizing method other than the one using a heating and pressurizing machine, vacuum molding or vacuum pressure molding is also preferable.

(Process v; Process of Curing Deformed Peeling or Falling Prevention Sheet)

When the peeling or falling prevention sheet 6 includes a thermosetting resin, after performing heating and pressurizing, the peeling or falling prevention sheet 6 is further heated at a temperature from 150° C. to 230° C. for 10 to 60 minutes in a state in which this sheet 6 is deformed, whereby the thermosetting resin in the peeling or falling prevention sheet 6 is thermally cured and thus the peeling or falling prevention layer 3 is formed. The peeling or falling prevention layer 3 firmly adheres to the electronic components 2 and the substrate 1 to function as the peeling or falling prevention layer 3 for preventing and protecting the electronic components 2 from being damaged due to external impacts or scratches. Note that, at the stage of (Process iv), for example, by setting the temperature of heating and pressurizing to 150° C. or higher and the time to 30 minutes or longer, thermal curing can be completed and the peeling or falling prevention layer 3 can be formed.

The electronic component-mounting substrate according to the present disclosure preferably has a peeling or falling prevention layer as the outermost layer. Further, other function layers may be laminated on the inner layer side. The other function layers are, for example, layers having functions such as conductivity, a hard coat property, a water vapor barrier property, an oxygen barrier property, thermal conductivity, a low dielectric constant property, a high dielectric constant property, a heat-resisting property or the like. Among them, the function layer having conductivity may be used to protect the electronic components to be coated and protected from electromagnetic wave noise.

Figure 4:
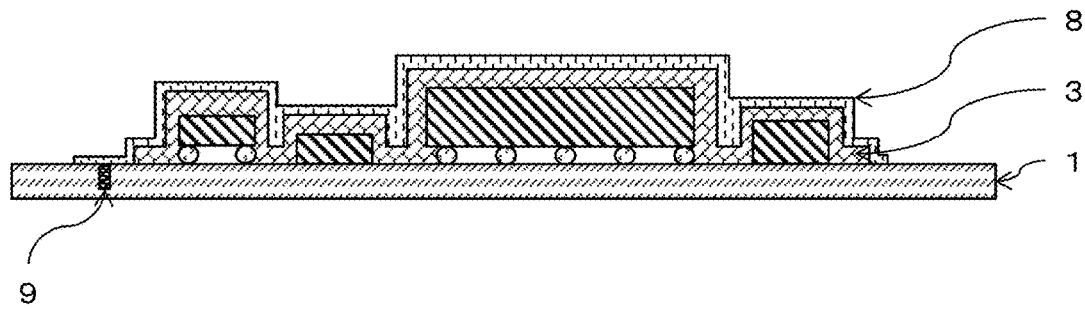
FIG. 4 is a schematic cross-sectional view showing one example of the electronic component-mounting substrate according to this embodiment.

FIG. 4 shows a configuration example of the electronic component-mounting substrate 12 including the function layer 8 having conductivity on the peeling or falling prevention layer 3. The function layer 8 having conductivity is formed on the upper side of the paper (upper layer) of the peeling or falling prevention layer 3 and is connected to the ground 9. The connection point with the ground 9 may be on the surface of the substrate 1, or may be on the side surface of the substrate 1. The function layer 8 having conductivity can be formed by a method of forming a metal layer (not shown) on the surface of the peeling or falling prevention layer 3 by sputtering or plating or a method of forming metal foil having conductivity, nonwoven fabric, or the like by laminating it on the peeling or falling prevention layer 3.

<<Electronic Device>>

The electronic component-mounting substrate according to the present disclosure is preferably included in a liquid crystal display, a touch panel, and other electronic devices such as a notebook PC, a mobile telephone, a smartphone, a tablet terminal or the like.

EXAMPLES

While the present disclosure will be described in detail with reference to Examples and Comparative Examples, the present disclosure is not limited to the following Examples. Note that the term "part" herein indicates a value based on "parts by mass (pts.mass)" unless otherwise specified.

Raw Materials

Raw materials used in Examples are shown below.

<Thermosetting Resin>

Thermosetting resin (r1): polyurethane resin (molecular weight (Mw)=130000, acid value 10 mgKOH/g, Tg=20° C.), manufactured by TOYOCHEM CO., LTD.

Thermosetting resin (r2): polyurethane resin (molecular weight (Mw)=125000, acid value 10 mgKOH/g, Tg=−6° C.), manufactured by TOYOCHEM CO., LTD.

Thermosetting resin (r3): acrylic resin (molecular weight (Mw)=55000, acid value 7 mgKOH/g, Tg=−20° C.), manufactured by TOYOCHEM CO., LTD.

<Curable Compound>

Curable compound (c1): tetra-functional epoxy resin "TETRAD-X" (epoxy equivalent=100/eq), manufactured by Mitsubishi Chemical Corporation Curable compound (c2): bi-functional epoxy resin "jER828" (epoxy equivalent=189 g/eq), manufactured by Mitsubishi Chemical Corporation Curable compound (c3): bi-functional epoxy resin "AER9000" (epoxy equivalent=380 g/eq), manufactured by Asahi Kasei E-Materials Corporation <Lubricants>

Lubricant (L1): carnauba wax "CERACOL79" (nano-volatile component 20 mass %), manufactured by BYK <Filler (B)>

Filler f1: carbon black "MA100" (product name, average primary particle diameter: 24 nm, BET specific surface area: 120 m$^2$/g), manufactured by Mitsubishi Chemical Corporation Filler f2: silica "Ultrasil U360" (product name, average primary particle diameter: 28 nm, BET specific surface area: 50 m$^2$/g), manufactured by NANOCYL Filler f3: silica "ADMAFINE SO-C5" (product name, average primary particle diameter: 2.0 μm. BET specific surface area: 2.1 m$^2$/g), manufactured by ADMATECHS COMPANY LIMITED Filler f4: plate-shaped boron nitride "HP-1" (product name, average primary particle diameter: 9.0 μm, BET specific surface area: 3.1 m$^2$/g), manufactured by JFE Mineral & Alloy Company, Ltd.

Filler f5: silica "EXCELICA SE-30K" (product name, average primary particle diameter: 25.1 μm, BET specific surface area: 0.7 m$^2$/g), manufactured by Tokuyama Corporation Filler f6: flaky silver powder "FA-S-18" (product name, average primary particle diameter: 3.1 μm, BET specific surface area: 2.0 m$^2$/g), manufactured by DOWA Filler f7: dendritic silver-coated copper powder "ACAX-225M" (product name, average primary particle diameter: 7.4 μm, BET specific surface area: 0.86 m$^2$/g), manufactured by MITSUI MINING & SMELTING CO., LTD.

<<Measurement Method>>

<Rate of Change X of Coefficient of Static Friction at Reciprocating Wear Test>

For the peeling or falling prevention layer in each of Examples and each of Comparative Examples, a chip (electronic component) made of a mold resin or a smooth part of 6 mm×6 mm square or more on an electronic component-mounting substrate, of a resin-containing area formed under a peeling or falling prevention layer, was measured as a test sample. By using a continuous loading surface property tester HEIDON Tribo Gear TYPE: 22H (manufactured by Shinto Scientific Co., Ltd.), a sufficiently dried test sample was mounted on a test stand, a load of 100 g was applied to a frictional element, and coefficients of static friction μk$_{100}$ and μk$_{300}$ when the cycles of reciprocation are 100 and 300 were recorded. Note that a ball indenter was used as a measurement tool for reciprocating on the test sample surface, and a SUS ball (ϕ(diameter) 3.0 mm) was used as the frictional element. The obtained coefficients of static friction μk$_{100}$ and μk$_{300}$ were applied to the following [Formula 1] to calculate the amount of change X of the coefficient of static friction at the time of reciprocating wear test.

$$X=(\mu k_{300}-\mu k_{100})/\mu k_{100}\times 100 \quad \text{[Formula 1]}$$

<Index Y>

As shown in FIG. 2, the cross sections of the peeling or falling prevention layer 3 and the electronic component-mounting substrate 12 according to each of Examples and each of Comparative Examples manufactured according to the method that will be described later were exposed by a polishing method, and radii of curvature R$_1$ and R$_2$ of curved surfaces of corner parts of the electronic component and the coated peeling or falling prevention layer were obtained by using a digital microscope VHX-7000 (product name, manufactured by KEYENCE CORPORATION). Similarly, the thickness of the thinnest part of the corner parts of the peeling or falling prevention layer (the thickness of the corner part of the peeling or falling prevention layer) A$_1$ was obtained. In the evaluations of these electronic components and the peeling or falling prevention layers, an MLCC with a size of 0.3 mm on the short side and 0.6 mm on the long side (hereinafter also referred to as 0603 MLCC, 0603 MLCC 30) was used. The obtained radii of curvature R$_1$ and R$_2$ and the thickness A$_1$ of the corner part of the peeling or falling prevention layer were applied to the following [Formula 2] to calculate the index Y.

$$Y=R_2/(R_1+A_1) \quad \text{[Formula 2]}$$

<Thickness A$_2$ of Peeling or Falling Prevention Layer>

Regarding the thickness of the peeling or falling prevention layer in the electronic component-mounting substrate, the cross section of the electronic component-mounting substrate was exposed by a polishing method, and the film thickness of a part that has the largest thickness on the upper surface area of the electronic components was measured by a digital microscope VHX-7000 (product name, manufactured by KEYENCE CORPORATION). The film thickness of five different samples of the exposed cross sections of electronic component-mounting substrates were measured in a similar way and the average value thereof was determined to be a thickness A$_2$.

<Average Particle Diameter of Filler (B)>

The average particle diameter of the filler (B) was obtained from the average value of 20 primary particles that can be observed from an image obtained by enlarging the image of the filler (B) by about 50,000 to 1,000,000 times using a transmission electron microscope (TEM). When the particle shape of the filler (B) has an average aspect ratio (major axis length/minor axis length) of 1.5 or greater, the average particle diameter was obtained by averaging the major axis length.

<Maximum Point Stress T of Peeling or Falling Prevention Layer>

A peeling or falling prevention sheet with a peelable film according to each of Examples and each of Comparative Examples was heated at 180° C. for two hours, and cut into a size of a width of 20 mm x a length of 60 mm. Next, the peelable film was peeled off to obtain a measurement sample (peeling or falling prevention layer) formed of a peeling or falling prevention sheet. Each measurement sample (peeling or falling prevention layer) was input into the atmosphere ranging from a normal temperature (e.g., 25° C.) to 100° C. (in the atmosphere, 50% RH (relative humidity)). One minute after that, under conditions of the same temperature, a tensile speed of 50 mm/min, and a relative humidity of 50%, a tensile test was conducted with an effective tensile size of 20×23 mm using a compact table-top tester EZ-TEST (product name, manufactured by Shimadzu Corporation). Then a maximum stress T (maximum point stress T) at a tensile speed of 50 mm/min was obtained.

<Glass Transition Temperature Tg>

Tg of a measurement sample (peeling or falling prevention layer) according to each of Example and each of Comparative Example was measured by a dynamic viscoelasticity measurement device DVA-200 (product name, manufactured by I.T. Keisoku Seigyo Co. Ltd.,) in compliance with JIS K7198. The measurement sample was obtained by cutting the peeling or falling prevention layer of each Example into a size of 0.5 cm×3 cm and peeling off or falling off a peelable film. The deformation form was tensile, and a temperature at which the main dispersion peak of a loss tangent (tanδ) measured at a strain of 0.08%, a frequency of 10 Hz, and a temperature rising rate of 10° C./min appeared was set as Tg. However, Tg cannot be calculated in a measurement in which the peeling or falling prevention layer is so fragile that it is broken during the measurement. In this case, it is shown as "Not measurable" in the tables in Examples.

<<Manufacturing of Peeling or Falling Prevention Sheet>>

Example 1

100 parts of thermosetting resin r1 (percent solids), 2.0 parts of curing agent c1, 10 parts of curing agent c2, 2.9 parts of filler f1, and 159 parts of filler f4 were put into a vessel, a mixed solvent of toluene isopropyl alcohol (mass ratio of 2:1) was added in such a way that the nonvolatile content concentration became 45 mass %, and stirred with a disper for 10 minutes, thereby obtaining a composition. This composition was applied to a releasable sheet using a doctor blade in such a way that the dry thickness became 80 µm. Then the obtained substrate was dried at 100° C. for two minutes to thereby obtain a peeling or falling prevention sheet in Example 1.

Examples 2 to 21, Comparative Examples 1 to 4

Peeling or Falling Prevention sheets (laminated sheets) according to Examples 2 to 21 and Comparative Examples 1 to 4 were obtained according to the manner similar to that described above except that the types of the materials and the amounts of them in Tables 1 to 3 were changed. Results of evaluating each of the peeling or falling prevention sheets that will be described later are also described.

[Manufacturing of Electronic Component-Mounting Substrate 1]

(Manufacturing of Mounting Substrate)

A substrate (mounting substrate) on which 5×1 mold-sealed electronic components (1 cm×1 cm) and 8×2 0603 MLCCs (length of 0.6 mm, width of 0.3 mm) are mounted in an array shape was prepared on a substrate made of glass epoxy. The thickness of the substrate was 0.6 mm and the mold sealing thickness, that is, the height (component height) H from the upper surface of the substrate to the top surface of the mold sealing material was 0.7 mm. The interval between the 0603 MLCCs was 200 µm.

The peeling or falling prevention sheet according to each of Examples and each of Comparative Examples was bonded to the above mounting substrate by thermocompression under conditions of 2 MPa and 180° C., for 5 minutes, and the cushion material was peeled off by hand. After that, the obtained substrate was heated at 180° C. for two hours to obtain the electronic component-mounting substrate in each of Examples and each of Comparative Examples based on Tables 1 to 3.

Evaluation

[Abrasion Resistance]

The peeling or falling prevention layer on the mold-sealed electronic component of the above mounting substrate was measured as a test area for the peeling or falling prevention layer of each of Examples and each of Comparative Examples. By using a continuous loading surface property tester HEIDON Tribo Gear TYPE: 22H (product name, manufactured by Shinto Scientific Co., Ltd.), a sufficiently dried test sample was mounted on a test stand, a load of 100 g was applied to a frictional element, and the surface condition of the test sample was observed after the cycles of reciprocation of the following evaluation criteria. Then, it was checked whether or not the base was exposed and the peeling or falling prevention layer was torn (reciprocating wear test). If it is difficult to perform the above evaluations visually, the surface condition was observed at 20× magnification using a digital microscope VHX-7000 (product name, manufactured by KEYENCE CORPORATION). A ball intender was used as a measurement tool for reciprocating on a surface of the test sample, and a SUS ball (43.0 mm) was used as a frictional element. From these results, the abrasion resistance was evaluated based on the following criteria.

Evaluation Criteria

+++: After 500 cycles of reciprocation, electronic components under the peeling or falling prevention layer were not exposed. (Extremely good)

++: After 400 cycles of reciprocation, electronic components under the peeling or falling prevention layer were not exposed, but after 500 cycles of reciprocation, electronic components under the peeling or falling prevention layer were exposed. (Good)

+: After 300 cycles of reciprocation, the electronic components under the peeling or falling prevention layer were not exposed, but after 400 cycles of reciprocation, the electronic components under the peeling or falling prevention layer were exposed. (Usable)

NG: At a point where cycles of reciprocation is less than 300 times (i.e., after 300 cycles of reciprocation), the electronic components under the peeling or falling prevention layer were exposed. (Poor)

[Peeling or Falling Prevention Properties]

Figure 5:
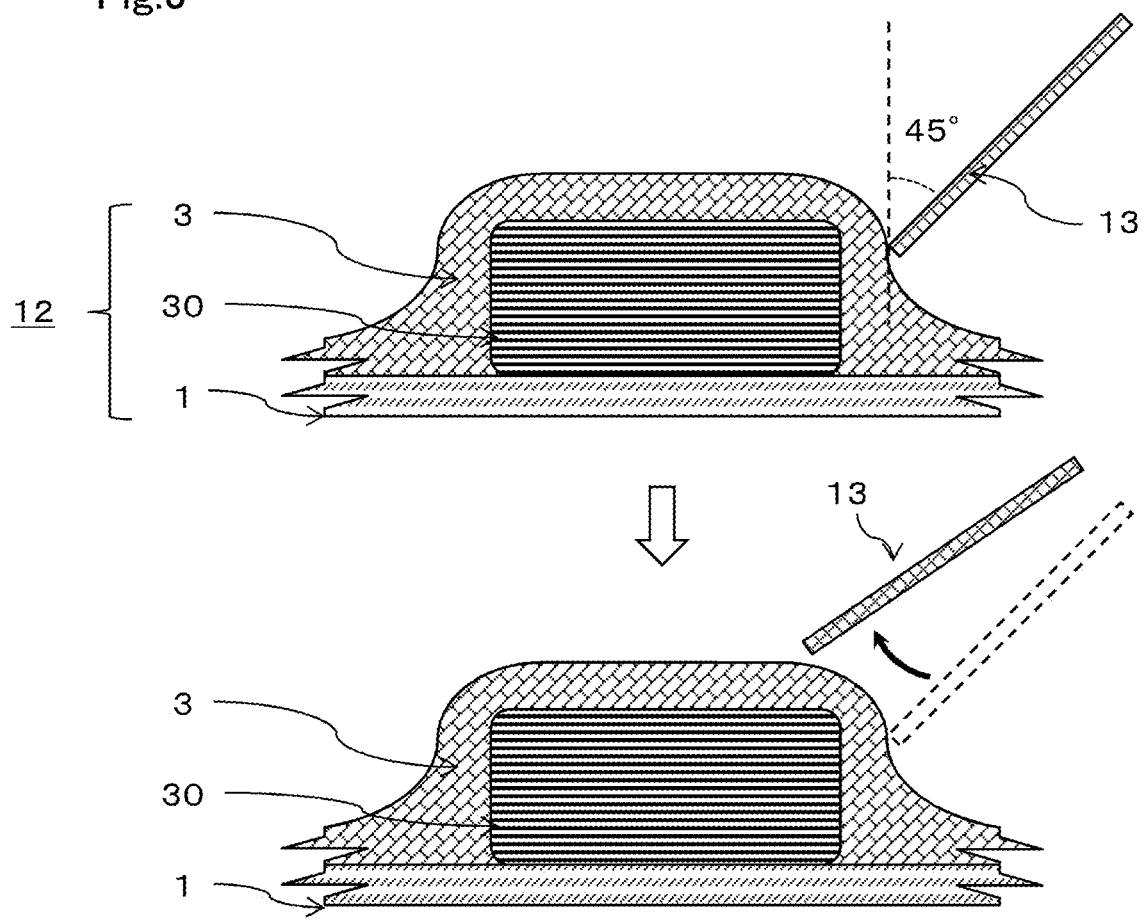
FIG. 5 is a diagram showing a method for evaluating the electronic component-mounting substrate according to Examples.

As shown in FIG. 5, an edge of a Ni-SUS plate 13 (a plate in which a nickel layer having a thickness of 2 µm is formed on a surface of a commercially available SUS304 plate having a thickness of 0.2 mm) was placed at an angle of 45° relative to the peeling or falling prevention layer 3 at the corner of the 0603 MLCC 30 of the electronic components 2 on the electronic component-mounting substrate manufactured by the aforementioned method, and each 0603 MLCC 30 was flipped from the side surface of its corner toward the top surface. This was repeated 30 times for each site, and the number of electronic components 30 peeling or falling off from the electronic component-mounting substrate after the above operation is performed on the peeling or falling prevention layers 3 on all the 16 0603 MLCCs 30 mounted on the electronic component-mounting substrate 12 was counted, and evaluated as peeling or falling prevention properties (peeling test). Components of 0603 MLCCs that are not coated with peeling or falling prevention layers were peeled off or fallen off after about 10 times of testing when the same test was conducted.

Note that "peeling off or falling off" means a state in which there are parts where there is no contact between the electronic component-mounting substrate and the electronic component due to peeling or separation that is caused by a breakage in a part between the electronic component-mounting substrate and the electronic component or a part between the electronic component-mounting substrate and the peeling or falling prevention layer, compared to the state before the test.

Evaluation Criteria

+++: The number of MLCCs that have been peeled off or fallen off is 0 (Extremely good)
++: The number of MLCCs that have been peeled off or fallen off is 1 (Good)
+: The number of MLCCs that have been peeled off or fallen off is 2 or 3 (Usable)
NG: The number of MLCCs that have been peeled off or fallen off is 4 or greater (Poor)

[Scratch Resistance]

A Ni-SUS plate having a size of 30 mm×80 mm (a plate in which a nickel layer having a thickness of 2 μm is formed on a surface of a commercially available SUS304 plate having a thickness of 0.2 mm) was prepared. The peeling or falling prevention sheet (25 mm×70 mm) according to each of Examples and each of Comparative Examples was bonded to the above Ni-SUS plate by thermocompression for five minutes at 2 MPa and 180° C., and a cushion material was peeled off by hand. After that, the sample was heated at 180° C. for two hours to obtain a measurement sample (peeling or falling prevention layer). A scratching test for continuously measuring a vertical load at which the peeling or falling prevention sheet coating the base at 50 mm/min was performed on the measurement sample using a continuous loading surface property tester HEIDON Tribo Gear TYPE: 22H (product name, manufactured by Shinto Scientific Co., Ltd.) in compliance with JIS K7317. A needle made of diamond (0.25 mmR) was used as a needle for scratching the test sample surface, and the sample was evaluated as scratch resistance according to the following criteria depending on the load at which the base was exposed from the measurement sample.

Note that the scratches in scratch resistance refer to a state in which the peeling or falling prevention layer is peeled off and the base is exposed as the peeling or falling prevention layer is torn or elongated when a tip of a scratching tool scratches the peeling or falling prevention layer, and do not refer to needle marks, the results of the observation of which can easily vary depending on the observer.

Evaluation Criteria

+++: Vertical load when base is exposed ≥350 g (Extremely good)
++: 350 g>Vertical load when base is exposed ≥250 g (Good)
+: 250 g>Vertical load when base is exposed ≥200 g (Usable)
NG: 200 g>Vertical load when base is exposed (Poor)

[Reliability]

A mold resin substrate (60 mm×50 mm) was prepared, and the peeling or falling prevention sheet (55 mm×45 mm) according to each of Examples and each of Comparative Examples was bonded by thermocompression at 2 MPa and 180° C. for five minutes, and a cushion material was peeled off by hand. Then, the sample was heated at 180° C. for two hours to obtain a measurement sample (peeling or falling prevention layer). 25 grids having a spacing of 1 mm were formed on a surface of the peeling or falling prevention layer on electronic components in the above measurement sample using a cross cut guide in compliance with JISK5600, adhesive tape was pressed, and the edge of the tape was pulled off at an angle of 45° all at once to perform a cross-cut test. As the adhesive tape, an adhesive tape having a width of 18 mm manufactured by Nichiban Co., Ltd. was used.

The condition of the peeling or falling prevention layer remaining on the mold resin substrate (crosscut residual ratio) of the substrate of the peeling or falling prevention layers was evaluated based on the following criteria.

Evaluation Criteria

+++: The crosscut residual ratio was 100/100. (Extremely good)
++: The crosscut residual ratio was 95 to 99/100. (Good)
+: The crosscut residual ratio was 80 to 94/100. (Usable)
NG: The crosscut residual ratio was lower than 80/100. (Poor)

A sealing seat was prepared by the same method as in Example 1 except that the content rate, the thickness Ta, and the protective film shown in Tables 1 to 3 were used, and evaluated in the same manner. All the crosslinking agents, oligomers, monomers, polymerization initiators, and other components were added at the same time.

TABLE 1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Electronic Component Peeling or Falling Prevention Layer | Composition | Thermosetting Resin r1 | 100 | 100 | 100 | 100 | 100 | 100 | 100 | 100 | 100 | 100 |
| | | r2 | 0 | 0 | 0 | 0 | 0 | 0 | 0 | 0 | 0 | 0 |
| | | r3 | 0 | 0 | 0 | 0 | 0 | 0 | 0 | 0 | 0 | 0 |
| | | Curable Compound c1 | 2.0 | 2.5 | 1.5 | 2.5 | 2.0 | 2.5 | 1.5 | 0.5 | 2.5 | 1.5 |
| | | c2 | 10.0 | 12.5 | 20.0 | 20.0 | 20.0 | 20.0 | 15.0 | 20.0 | 5.0 | 0 |
| | | c3 | 0 | 0 | 0 | 0 | 0 | 0 | 0 | 0 | 0 | 5.0 |
| | | Lubricants Type | L1 | None | None | None | None | None | None | None | None | L1 |
| | | [pts.mass] | 0.50 | 0 | 0 | 0 | 0 | 0 | 0 | 0 | 0 | 0.50 |
| | | Binder Component | 113 | 115 | 122 | 123 | 122 | 123 | 117 | 121 | 108 | 107 |
| | | Filler Type | f1 | f1 | f1 | f1 | f4 | f1 | f1 | f1 | f1 | f1 |
| | | [mass %] | 1.00% | 1.00% | 1.00% | 1.00% | 5.00% | 1.00% | 1.00% | 0% | 1.00% | 1.00% |
| | | Average Particle Diameter [μm] | 0.024 | 0.024 | 0.024 | 0.024 | 9.0 | 0.024 | 0.024 | 0 | 0.024 | 0.024 |
| | | BET Specific Surface Area [m²/g] | 120 | 120 | 120 | 120 | 3.1 | 120 | 120 | 0 | 120 | 120 |
| | | Content Rate × BET Specific Surface Area | 1.20 | 1.20 | 1.20 | 1.20 | 0.155 | 1.20 | 1.20 | — | 1.21 | 1.20 |
| | | Type | f4 | f4 | f6 | f4 | — | f2 | — | — | f3 | f2 |
| | | [mass %] | 54.0% | 35.0% | 19.0% | 9.00% | 0% | 9.00% | 0% | 0% | 19.0% | 9.00% |
| | | Average Particle Diameter [μm] | 9.0 | 9.0 | 9.0 | 9.0 | 0 | 0.028 | 0 | 0 | 2.0 | 0.028 |
| | | BET Specific Surface Area [m²/g] | 3.1 | 3.1 | 3.1 | 3.1 | 0 | 50 | 0 | 0 | 2.1 | 50 |
| | | Content Rate × BET Specific Surface Area | 1.67 | 1.09 | 0.380 | 0.279 | 0 | 4.50 | 0 | 0 | 0.399 | 4.50 |
| | | Total Filler Content Ratio [mass %] | 55% | 36% | 20% | 10% | 5.0% | 10% | 1.0% | 0% | 20% | 10% |
| | | Total of Filler Content Rate × BET Specific Surface Area | 2.87 | 2.29 | 1.58 | 1.48 | 0.155 | 5.70 | 1.20 | 0 | 1.60 | 5.70 |
| | Physical Properties | Total [pts.mass] | 250 | 180 | 152 | 136 | 128 | 136 | 118 | 121 | 334 | 119 |
| | | Coefficient of Static Friction μk at Reciprocating Wear Test (on Mold) | 0.36 | 0.38 | 0.41 | 0.39 | 0.48 | 0.58 | 0.31 | 0.55 | 0.29 | 0.27 |
| | | After 100 Cycles of Reciprocation μk₁₀₀ | 0.20 | 0.25 | 0.32 | 0.31 | 0.46 | 0.52 | 0.50 | 1.08 | 0.61 | 0.66 |
| | | After 300 Cycles of Reciprocation μk₃₀₀ Rate of Change X = (μk₃₀₀ − μk₂₀₀)/μk₁₀₀ × 100 | −44% | −34% | −22% | −21% | −4.2% | 6.7% | 61% | 96% | 110% | 144% |
| | | Shape of Peeling or Falling Prevention Layer at Corner Radius of Curvature of Electronic Component R₁ [μm] | 14 | 15 | 12 | 10 | 10 | 6 | 8 | 11 | 9 | 7 |
| | | Radius of Curvature after Sheet Processing R₂ [μm] | 64 | 65 | 278 | 42 | 120 | 53 | 67 | 159 | 63 | 71 |
| | | Thickness of Corner Part A1 [μm] | 56 | 64 | 22 | 39 | 17 | 38 | 5 | 3 | 68 | 9 |
| | | Index Y = R₂/(R₁ + A₁) | 0.914 | 0.823 | 8.18 | 0.857 | 4.44 | 1.20 | 5.15 | 11.4 | 0.818 | 4.44 |
| | | Thickness of Peeling or Falling Prevention Layer A2 [μm] | 68 | 70 | 38 | 44 | 35 | 51 | 31 | 25 | 73 | 30 |
| | | Reciprocating Wear Test (Base: Mold) [Times] | 330 | 390 | 470 | 470 | 500 | 500 | 500 | 500 | 470 | 430 |
| | | Number of Electronic Components peeling or falling off at Peeling Test [Number] | 1 | 3 | 1 | 2 | 0 | 1 | 1 | 3 | 2 | 0 |
| | | Scratching Strength Test (Base: SUS) [N] | 290 | 260 | 330 | 350 | 350 | 410 | 315 | 320 | 290 | 390 |
| | | Maximum Point Stress T (25° C.) [MPa] | 45 | 28 | 25 | 29 | 31 | 35 | 31 | 14.9 | 41 | 35 |
| | | Tg [° C.] | 49.5 | 52.1 | 52.3 | 52.1 | 53.1 | 53.0 | 23.5 | 56.9 | 49.1 | 36.2 |

TABLE 1-continued

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Evaluation | Abrasion Resistance | + | + | ++ | ++ | +++ | +++ | +++ | +++ | ++ | ++ |
| | Peeling or Falling Prevention Properties | ++ | ++ | ++ | + | +++ | ++ | ++ | ++ | + | +++ |
| | Scratch Resistance | ++ | +++ | +++ | +++ | +++ | +++ | +++ | +++ | +++ | +++ |
| | Reliability | +++ | +++ | +++ | +++ | +++ | +++ | +++ | +++ | +++ | +++ |

TABLE 2

| | | Example 11 | Example 12 | Example 13 | Example 14 | Example 15 | Example 16 | Example 17 | Example 18 | Example 19 | Example 20 | Example 21 |
|---|---|---|---|---|---|---|---|---|---|---|---|---|
| Electronic Component Peeling or Falling Prevention Layer | Composition | | | | | | | | | | | |
| | Thermosetting Resin r1 | 0 | 0 | 0 | 0 | 0 | 100 | 0 | 0 | 0 | 0 | 0 |
| | r2 | 100 | 100 | 100 | 100 | 100 | 0 | 100 | 0 | 100 | 100 | 0 |
| | r3 | 0 | 0 | 0 | 0 | 0 | 0 | 0 | 100 | 0 | 0 | 100 |
| | Curable Compound c1 | 1.5 | 2.5 | 0.25 | 1.5 | 0.5 | 0.8 | 3.0 | 3.0 | 2.0 | 3.5 | 1.5 |
| | c2 | 0 | 10.0 | 0 | 40.0 | 35.0 | 30.0 | 0 | 9.0 | 30.0 | 20.0 | 35.0 |
| | c3 | 20.0 | 0 | 40.0 | 0 | 0 | 0 | 15.0 | 0 | 0 | 0 | 0 |
| | Lubricants Type | None | None | None | None | None | L1 | None | L1 | None | None | None |
| | [pts.mass] | 0 | 0 | 0 | 0 | 0 | 0.50 | 0 | 1 | 0 | 0 | 0 |
| | Binder Component Total [pts.mass] | 122 | 113 | 140 | 142 | 136 | 131 | 118 | 113 | 132 | 124 | 124 |
| | Filler Type | f1 | f1 | f1 | f1 | f1 | f1 | f1 | f1 | f2 | f2 | f1 |
| | [mass %] | 1.00% | 1.00% | 1.00% | 17.5% | 1.00% | 1.00% | 12.5% | 12.0% | 22.5% | 18.0% | 1.0% |
| | Average Particle Diameter [μm] | 0.024 | 0.024 | 0.024 | 0.024 | 0.024 | 0.024 | 0.024 | 0.024 | 0.028 | 0.028 | 0024 |
| | BET Specific Surface Area [m²/g] | 120 | 120 | 120 | 120 | 120 | 120 | 120 | 120 | 50 | 50 | 120 |
| | Content Rate × BET Specific Surface Area | 1.20 | 1.19 | 1.21 | 21.0 | 1.20 | 1.20 | 15.0 | 14.4 | 11.2 | 9.00 | 1.20 |
| | Type | f3 | f5 | f5 | f5 | f3 | f3 | f4 | f7 | f7 | f5 | f2 |
| | [mass %] | 9.00% | 19.0% | 39.0% | 0% | 9.00% | 9.00% | 30.0% | 38.0% | 7.49% | 5.00% | 29.00% |
| | Average Particle Diameter [μm] | 2.0 | 25 | 14 | 25 | 2.0 | 2.0 | 9.0 | 7.4 | 7.4 | 25 | 0 |
| | BET Specific Surface Area [m²/g] | 2.1 | 0.70 | 2.2 | 0.70 | 2.1 | 2.1 | 3.1 | 0.86 | 0.86 | 0.70 | 50 |
| | Content Rate × BET Specific Surface Area | 0.189 | 0.133 | 0.859 | 0 | 0.189 | 0.189 | 0.930 | 0.327 | 0.0644 | 0.0350 | 14.5 |
| | Total Filler Content Ratio [mass %] | 10% | 20% | 40% | 17.5% | 10.0% | 10.0% | 42.5% | 50.0% | 30.0% | 23.0% | 30.0% |
| | Total of Filler Content Rate × BET Specific Surface Area | 1.39 | 1.33 | 2.06 | 21.0 | 1.38 | 1.39 | 15.9 | 14.7 | 11.3 | 9.04 | 15.7 |
| Physical Properties | Coefficient of Static Friction μk at Reciprocating Wear Test (on Mold) | | | | | | | | | | | |
| | After 100 Cycles of Reciprocation μk₁₀₀ | 135 | 141 | 234 | 172 | 151 | 146 | 205 | 226 | 188 | 168 | 195 |
| | | 0.23 | 0.41 | 0.51 | 0.19 | 0.28 | 0.27 | 0.39 | 0.41 | 0.32 | 0.39 | 0.20 |
| | After 300 Cycles of Reciprocation μk₃₀₀ | 0.60 | 1.18 | 1.51 | 0.53 | 0.53 | 0.34 | 0.28 | 1.12 | 0.53 | 1.02 | 0.26 |
| | Rate of Change X = (μk₃₀₀ − μk₂₀₀)/μk₁₀₀ × 100 | 157% | 188% | 196% | 179% | 89% | 24% | −29% | 173% | 66% | 159% | 30% |
| | Shape of Peeling or Falling Prevention Layer at Corner | 8 | 11 | 9 | 11 | 13 | 9 | 12 | 11 | 8 | 11 | 9 |
| | Radius of Curvature of Electronic Component R₁ [μm] | 82 | 61 | 197 | 49 | 345 | 234 | 52 | 61 | 81 | 94 | 121 |
| | Radius of Curvature R₂ after Sheet Processing R₂ [μm] | 6 | 51 | 7 | 41 | 5 | 3 | 47 | 51 | 22 | 28 | 56 |
| | Thickness of Corner Part A1 [μm] | 5.86 | 0.984 | 12.3 | 0.942 | 19.2 | 19.5 | 0.881 | 0.984 | 2.70 | 2.41 | 1.86 |
| | Index Y = R₂/(R₁ + A₁) | 41 | 63 | 55 | 52 | 70 | 59 | 69 | 63 | 55 | 61 | 57 |
| | Thickness of Peeling or Falling Prevention Layer A2 [μm] | | | | | | | | | | | |

TABLE 2-continued

|  |  | Example 11 | Example 12 | Example 13 | Example 14 | Example 15 | Example 16 | Example 17 | Example 18 | Example 19 | Example 20 | Example 21 |
|---|---|---|---|---|---|---|---|---|---|---|---|---|
|  | Reciprocating Wear (Base: Mold) [Times] Test | 390 | 380 | 305 | 340 | 500 | 500 | 330 | 300 | 500 | 380 | 500 |
|  | Number of Electronic Components peeling or falling off at Peeling Test [Number] | 1 | 1 | 2 | 3 | 2 | 2 | 2 | 1 | 0 | 0 | 0 |
|  | Scratching Strength (Base: SUS) [N] Test | 380 | 370 | 320 | 220 | 230 | 240 | 210 | 330 | 360 | 420 | 240 |
|  | Maximum Point Stress T (25° C.) [MPa] | 31 | 37 | 39 | 42 | 13 | 15 | 21 | 27 | 38 | 43 | 23 |
|  | Tg [° C.] | 15.4 | 49.2 | 18.2 | 49.5 | 51.3 | 52.5 | 39.0 | 86.3 | 46.3 | 57.6 | 39.3 |
| Evaluation | Abrasion Resistance | + | + | + | + | +++ | +++ | + | + | +++ | + | +++ |
|  | Peeling or Falling Prevention Properties | ++ | ++ | ++ | ++ | + | + | + | ++ | +++ | +++ | +++ |
|  | Scratch Resistance | +++ | +++ | ++ | +++ | +++ | +++ | + | ++ | +++ | ++ | + |
|  | Reliability | ++ | +++ | + | +++ | + | +++ | ++ | +++ | ++ | ++ | +++ |

TABLE 3

|  |  |  |  | Comparative Example 1 | Comparative Example 2 | Comparative Example 3 | Comparative Example 4 |
|---|---|---|---|---|---|---|---|
| Electronic Component Peeling or Falling Prevention Layer | Composition | Thermosetting Resin | r1 | 0 | 100 | 100 | 0 |
|  |  |  | r2 | 0 | 0 | 0 | 100 |
|  |  |  | r3 | 100 | 0 | 0 | 0 |
|  |  | Curable Compound | c1 | 5.3 | 0.40 | 2.0 | 0.20 |
|  |  |  | c2 | 50.0 | 20.0 | 25.0 | 40.0 |
|  |  |  | c3 | 0 | 0 | 0 | 0 |
|  |  | Lubricants | Type | None | L1 | L1 | None |
|  |  |  | [pts.mass] | 0 | 1.0 | 1.0 | 0 |
|  |  | Binder Component |  | 155 | 121 | 128 | 140 |
|  |  | Filler | Type | f1 | f1 | f6 | f3 |
|  |  |  | [mass %] | 1.00% | 1.00% | 70.0% | 10.0% |
|  |  |  | Average Particle Diameter [μm] | 0.024 | 0.024 | 3.1 | 2.0 |
|  |  |  | BET Specific Surface Area [m²/g] | 120 | 120 | 2.0 | 2.1 |
|  |  |  | Content Rate × BET Specific Surface Area | 1.20 | 1.20 | 1.40 | 0.210 |
|  |  |  | Type | f6 | f5 | — | — |
|  |  |  | [mass %] | 39.0% | 39.0% | 0% | 0% |
|  |  |  | Average Particle Diameter [μm] | 3.1 | 25 | 0 | 0 |
|  |  |  | BET Specific Surface Area [m²/g] | 2.0 | 0.70 | 0 | 0 |
|  |  |  | Content Rate × BET Specific Surface Area | 0.780 | 0.273 | 0 | 0 |
|  |  | Total Filler Content Ratio [mass %] |  | 40.0% | 40.0% | 70.0% | 10.0% |
|  |  | Total of Filler Content Rate × BET Specific Surface Area |  | 1.98 | 1.47 | 1.40 | 0.210 |
|  |  | Total [pts.mass] |  | 259 | 202 | 427 | 156 |
|  | Physical Properties | Coefficient of Static Friction μk at Reciprocating Wear Test (on Mold) | After 100 Cycles of Reciprocation $\mu k_{100}$ | 0.42 | 0.53 | 0.23 | 0.20 |
|  |  |  | After 300 Cycles of Reciprocation $\mu k_{300}$ | 0.20 | 1.62 | 0.51 | 0.41 |
|  |  |  | Rate of Change $X = (\mu k_{300} - \mu k_{200})/\mu k_{100} \times 100$ | −53% | 206% | 122% | 105% |
|  |  | Shape of Peeling or Falling Prevention Layer at Corner Part of Electronic Component | Radius of Curvature of Electronic Component $R_1$ [μm] | 8 | 9 | 7 | 10 |
|  |  |  | Radius of Curvature after Sheet Processing $R_2$ [μm] | 85 | 157 | 58 | 289 |
|  |  |  | Thickness of Corner Part $A_1$ [μm] | 52 | 16 | 71 | 3 |
|  |  |  | Index $Y = R_2/(R_1 + A_1)$ | 1.42 | 6.28 | 0.744 | 22.2 |
|  |  | hickness of Peeling or Falling Prevention Layer A2 [μm] |  | 62 | 55 | 73 | 64 |
|  |  | Reciprocating Wear Test | (Base: Mold) [Times] | 280 | 80 | 470 | 420 |
|  |  | Number of Electronic Components peeling or falling off at Peeling Test [Number] |  | 1 | 3 | 9 | 4 |
|  |  | Scratching Strength Test | (Base: SUS) [N] | 340 | 240 | 320 | 360 |
|  |  | Maximum Point Stress T | (25° C.) [MPa] | 41 | 0.46 | 53 | 12 |
|  |  | Tg | [° C.] | 53.1 | Not measurable | 58.7 | 48.1 |
| Evaluation |  | Abrasion Resistance |  | NG | NG | + | ++ |
|  |  | Peeling or Falling Prevention Properties |  | +++ | ++ | NG | NG |
|  |  | Scratch Resistance |  | ++ | + | ++ | +++ |
|  |  | Reliability |  | +++ | +++ | +++ | ++ |

It was confirmed that a peeling or falling prevention layer in which the rate of change X of the coefficient of static friction is less than −50% or greater than 200% has problems with abrasion resistance and peeling or falling prevention properties, as shown in Comparative Example 1 or 2. It was also confirmed that a peeling or falling prevention layer in which the index Y is less than 0.8 or greater than 20.0 has problems with peeling or falling prevention properties, as shown in Comparative Example 3 or 4. On the other hand, the peeling or falling prevention layers in the above Examples that satisfy both (1) and (2) in claim 1 have excellent abrasion resistance, peeling or falling prevention properties, scratch resistance, and reliability.

This application is based upon and claims the benefit of priority from Japanese patent application No. 2023-202349, filed on Nov. 30, 2023, the disclosure of which is incorporated herein in its entirety by reference.

REFERENCE SIGNS LIST

1: SUBSTRATE
2: ELECTRONIC COMPONENT
3: PEELING OR FALLING PREVENTION LAYER
4: SOLDER BUMP
5: HOLLOW PART
6: PEELING OR FALLING PREVENTION SHEET
7: CUSHION MATERIAL
8: FUNCTION LAYER
9: GROUND
10: ELECTRONIC COMPONENT-MOUNTING SUBSTRATE
11: ELECTRONIC COMPONENT-MOUNTING SUBSTRATE
12: ELECTRONIC COMPONENT-MOUNTING SUBSTRATE HAVING FUNCTION LAYER
13: Ni-SUS PLATE
20: HEATING AND PRESSURIZING MACHINE
30: 0603 MLCC
100: MOUNTING SUBSTRATE

The invention claimed is:

1. An electronic component-mounting substrate comprising:
    a substrate;
    an electronic component mounted on at least one surface of the substrate; and
    a peeling or falling prevention layer that coats the substrate and the electronic component, wherein
    the peeling or falling prevention layer satisfies both the following (1) and (2):
(1) a rate of change X of a coefficient of static friction obtained in the following [Formula 1] is −50% or greater and 200% or smaller:

$$X = (\mu k_{300} - \mu k_{100})/\mu k_{100} \times 100 \quad \text{[Formula 1]}$$

wherein $\mu k_{100}$ is a coefficient of static friction at a 100-th reciprocating wear test of the peeling or falling prevention layer, and $\mu k_{300}$ is a coefficient of static friction at a 300-th reciprocating wear test of the peeling or falling prevention layer; and
(2) an index Y obtained in the following [Formula 2] is 0.8 or greater and 20.0 or smaller:

$$Y = R_2/(R_1 + A_1) \quad \text{[Formula 2]}$$

wherein $R_1$ is a radius of curvature of a curved surface of a corner part of the electronic component in a cross section of the electronic component-mounting substrate, $R_2$ is a radius of curvature of a corner part of the peeling or falling prevention layer in the cross section of the electronic component-mounting substrate, and $A_1$ is a thickness of the corner part of the peeling or falling prevention layer in the cross section of the electronic component-mounting substrate.

2. The electronic component-mounting substrate according to claim 1, wherein
    the peeling or falling prevention layer includes a binder (A) and a filler (B), and
    a product of a BET specific surface area [m²/g] of the filler (B) and a content rate [mass %] of the filler (B) in 100 mass % of the peeling or falling prevention layer is 0.01 to 15 [mass %·m²/g].

3. The electronic component-mounting substrate according to claim 1, wherein a thickness $A_2$ of the peeling or falling prevention layer is 5 to 300 μm.

4. An electronic device on which the electronic component-mounting substrate according to claim 1 is mounted.

5. The electronic component-mounting substrate according to claim 2, wherein a thickness $A_2$ of the peeling or falling prevention layer is 5 to 300 μm.

6. An electronic device on which the electronic component-mounting substrate according to claim 2 is mounted.

7. An electronic device on which the electronic component-mounting substrate according to claim 3 is mounted.

8. An electronic device on which the electronic component-mounting substrate according to claim 5 is mounted.

* * * * *